(12) United States Patent
Cheng et al.

(10) Patent No.: US 12,556,138 B2
(45) Date of Patent: Feb. 17, 2026

(54) SEMICONDUCTOR DEVICE AND OPERATING METHOD THEREOF

(71) Applicants: TAIWAN SEMICONDUCTOR MANUFACTURING COMPANY, LTD., Hsinchu (TW); NATIONAL CHENG KUNG UNIVERSITY, Tainan (TW)

(72) Inventors: Kuang-Wei Cheng, Tainan (TW); Chao An Shen, Tainan (TW); Tai Jung Hsu, Taichung (TW)

(73) Assignees: TAIWAN SEMICONDUCTOR MANUFACTURING COMPANY, LTD., Hsinchu (TW); NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 18/679,255

(22) Filed: May 30, 2024

(65) Prior Publication Data

US 2025/0373201 A1 Dec. 4, 2025

(51) Int. Cl.
*H03B 5/12* (2006.01)

(52) U.S. Cl.
CPC ......... *H03B 5/1243* (2013.01); *H03B 5/1228* (2013.01); *H03B 5/1296* (2013.01); *H03B 2201/0208* (2013.01)

(58) Field of Classification Search
CPC .. H03B 5/1243; H03B 5/1228; H03B 5/1296; H03B 2201/0208

USPC ................................ 331/117 FE, 167, 177 V
See application file for complete search history.

(56) References Cited

U.S. PATENT DOCUMENTS

| | | | |
|---|---|---|---|
| 6,946,924 B2* | 9/2005 | Chominski | H03B 5/1231 331/177 V |
| 7,154,349 B2* | 12/2006 | Cabanillas | H03B 5/1265 331/177 V |
| 2013/0044838 A1 | 2/2013 | Ding et al. | |
| 2022/0415789 A1 | 12/2022 | Krishnamurthi et al. | |

FOREIGN PATENT DOCUMENTS

| | | |
|---|---|---|
| CN | 103095217 A | 5/2013 |
| CN | 117478067 A | 1/2024 |
| TW | 200837804 A | 9/2008 |
| TW | 201238235 A | 9/2012 |

OTHER PUBLICATIONS

5G Observatory, "National 5G Spectrum Assignment", Accessed: Dec. 19, 2022, webpage, accessed at http://5gobservatory.eu/5g-spectrum/national-5g-spectrum-assignment/.
Federal Communications Commission "America's 5G Future". Accessed: Dec. 19, 2022. Available: https://www.fcc.gov/5G.
(Continued)

*Primary Examiner* — Arnold M Kinkead
(74) *Attorney, Agent, or Firm* — Maschoff Brennan (57) ABSTRACT

A semiconductor device includes a first inductor, a second inductor and at least one varactor. The first inductor is configured to output at least one output signal. The second inductor is coupled to the first inductor with transformer coupling. The at least one varactor is coupled to the second inductor. A frequency of the at least one output signal is tuned according to the at least one varactor.

20 Claims, 7 Drawing Sheets

(56) References Cited

OTHER PUBLICATIONS

Bishnu Patra et al., "Cryo-CMOS Circuits and Systems for Quantum Computing Applications" IEEE Journal of Solid-State Circuits, vol. 53, No. 1, pp. 309-321, Jan. 2018.
Jiang Gong et al., "A Cryo-CMOS PLL for Quantum Computing Applications" IEEE Journal of Solid-State Circuits, vol. 58, No. 5, pp. 1362-1375, May 2023.
KaChun Kwok et al., "Ultra-low-Voltage high-performance CMOS VCOs using transformer feedback" IEEE Journal of Solid-State Circuits, vol. 40, No. 3, pp. 652-660, Mar. 2005.
Ali Hajimiri et al., "A general theory of phase noise in electrical oscillators" IEEE Journal of Solid-State Circuits, vol. 33, No. 2, pp. 179-194, Feb. 1998.
Salvatore Levantino et al., "Frequency dependence on bias current in 5 Ghz CMOS VCOs: impact on tuning range and flicker noise upconversion" IEEE Journal of Solid-State Circuits, vol. 37, No. 8, pp. 1003-1011, Aug. 2002.
Emad Hegazi et al., "A filtering technique to lower LC oscillator phase noise" IEEE Journal of Solid-State Circuits, vol. 36, No. 12, pp. 1921-1930, Dec. 2001.
Mina Shahmohammadi et al., "A 1/f Noise Upconversion Reduction Technique for Voltage-Biased RF CMOS Oscillators," IEEE Journal of Solid-State Circuits, vol. 51, No. 11, pp. 2610-2624, Nov. 2016.
David Murphy et al., "Implicit Common-Mode Resonance in LC Oscillators" IEEE Journal of Solid-State Circuits, vol. 52, No. 3, pp. 812-821, Mar. 2017.
Masoud Babaie et al., "A Class-F CMOS Oscillator" IEEE Journal of Solid-State Circuits, vol. 48, No. 12, pp. 3120-3133, Dec. 2013.
Yizhe Hu et al., "Oscillator Flicker Phase Noise: A Tutorial" IEEE Transactions on Circuits and Systems II: Express Briefs, vol. 68, No. 2, pp. 538-544, Feb. 2021.
Shita Guo et al., "A Low-Voltage Low-Phase-Noise 25-GHz Two-Tank Transformer-Feedback VCO" IEEE Transactions on Circuits and Systems I: Regular Papers, vol. 65, No. 10, pp. 3162-3173, Oct. 2018.
Xiaolong Liu et al., "Analysis and Design of Magnetically Tuned W-Band Oscillators" IEEE Transactions on Very Large Scale Integration (VLSI) Systems, vol. 30, No. 6, pp. 732-743, Jun. 2022.
Omid Esmaeeli et al., "A Transformer-Based Technique to Improve Tuning Range and Phase Noise of a 20-28GHz LC-VCO and a 51-62GHz Self-Mixing LC-VCO" IEEE Transactions on Circuits and Systems I: Regular Papers, vol. 69, No. 6, pp. 2351-2363, Jun. 2022.
Jun Yin et al., "A 57.5-90.1-GHz Magnetically Tuned Multimode CMOS VCO" IEEE Journal of Solid-State Circuits, vol. 48, No. 8, pp. 1851-1861, Aug. 2013.
Xiaolong Liu et al., "Transformer-based varactor-less 96GHZ-110GHz VCO and 89GHZ-101GHz QVCO in 65nm CMOS," IEEE Asian Solid-State Circuits Conference (A-SSCC), pp. 357-360, 2016.
Milad Haghi Kashani et al., "On the Design of a High-Performance mm-Wave VCO With Switchable Triple-Coupled Transformer" IEEE Transactions on Microwave Theory and Techniques, vol. 67, No. 11, pp. 4450-4464, Nov. 2019.
Hao-Jiun Wu et al., "60-GHz Millimeter-Wave Voltage-Controlled Oscillators Using Transformer—Tuning Technique," Asia-Pacific Microwave Conference (APMC), pp. 1124-1126, 2018.
Charles K. Alexander et al., "Fundamentals of Electric Circuits", 6th edition, 2016.
Behzad Razavi, "RF Microelectronics", second edition, 2011.
Yupeng Fu et al., "A-193.6 dBc/Hz FoMT 28.6-to-36.2 GHZ Dual-Core CMOS VCO for 5G Applications" IEEE Access, vol. 8, pp. 62191-62196, 2020.
You-Da Chen et al., "A Wide Tuning-Range Triple-Mode CMOS VCO Using Switched-Tunable Inductor," IEEE Microwave and Wireless Components Letters, vol. 31, No. 9, pp. 1063-1066, Sep. 2021.
Milad Haghi Kashani et al., "A 2.3-mW 26.3-GHz Gm—Boosted Differential Colpitts VCO With 20% Tuning Range in 65-nm CMOS" IEEE Transactions on Microwave Theory and Techniques, vol. 67, No. 4, pp. 1556-1565, Apr. 2019.
Yu-Teng Chang et al., "A K -Band High-Efficiency VCO Using Current Reused Technique" IEEE Microwave and Wireless Components Letters, vol. 27, No. 12, pp. 1134-1136, Dec. 2017.
Pawan Agarwal et al., "Switched Substrate-Shield-Based Low-Loss CMOS Inductors for Wide Tuning Range VCOs" IEEE Transactions on Microwave Theory and Techniques, vol. 65, No. 8, pp. 2964-2976, Aug. 2017.
Hsieh-Hung Hsieh et al., "A High-Performance CMOS Voltage-Controlled Oscillator for Ultra-Low-Voltage Operations" IEEE Transactions on Microwave Theory and Techniques, vol. 55, No. 3, pp. 467-473, Mar. 2007.
Yue Chao et al., "Analysis and Design of Wide-Band Millimeter-Wave Transformer-Based VCO and ILFDs" IEEE Transactions on Circuits and Systems I: Regular Papers, vol. 63, No. 9, pp. 1416-1425, Sep. 2016.
Andrea Mazzanti et al., "On the Phase Noise Performance of Transformer-Based CMOS Differential-Pair Harmonic Oscillators" IEEE Transactions on Circuits and Systems I: Regular Papers, vol. 62, No. 9, pp. 2334-2341, Sep. 2015.
Jimmin Chang et al., "Flicker noise in CMOS transistors from subthreshold to strong inversion at various temperatures" IEEE Transactions on Electron Devices, vol. 41, No. 11, pp. 1965-1971, Nov. 1994.
Bishnu Patra et al., "Characterization and Analysis of On-Chip Microwave Passive Components at Cryogenic Temperatures" Journal of the Electron Devices Society, vol. 8, pp. 448-456, 2020.

* cited by examiner

SEMICONDUCTOR DEVICE AND OPERATING METHOD THEREOF

BACKGROUND

For radio frequency (RF) circuit design, the voltage-controlled oscillator (VCO) plays an important role and requires low power consumption and low phase noise. A two-tank transformer-feedback VCO is proposed to achieve excellent phase noise performance with low supply voltage. However, it uses only one control voltage to simultaneously tune both two tank switched capacitor banks and varactors. This can potentially result in a mismatch between the two tank varactors and become challenging to integrate them into phase-locked loop applications in the future.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the downscaling of the integrated circuits.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

Figure 1:
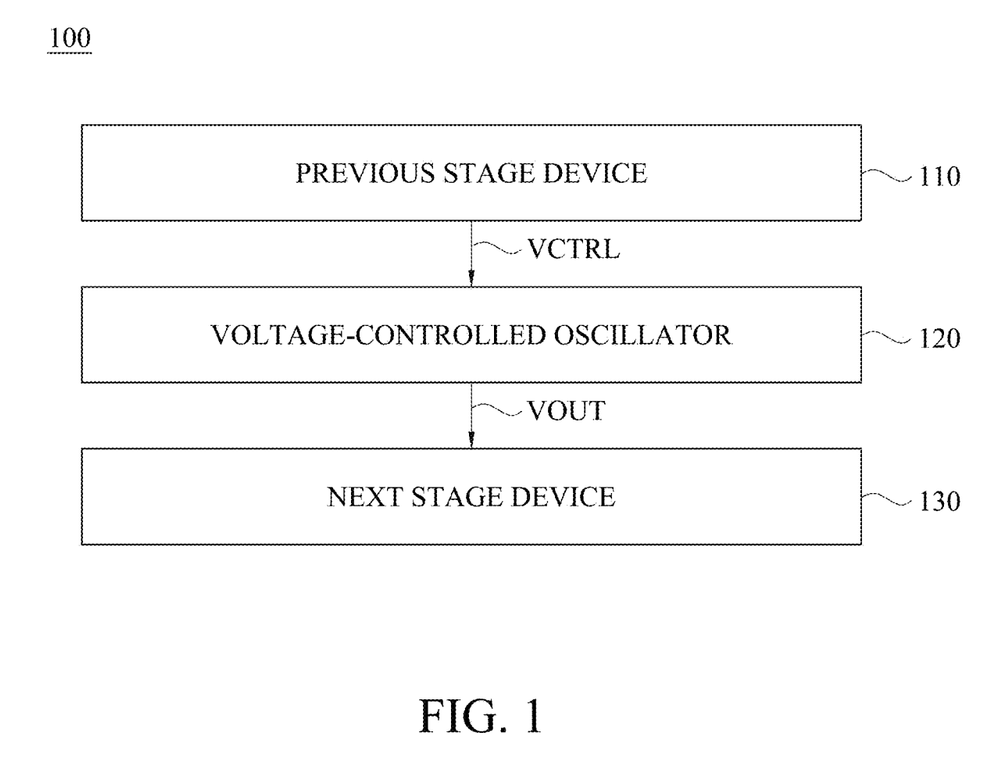
FIG. 1 is a schematic diagram of a system in accordance with some embodiments of the present disclosure.

FIG. 1 is a schematic diagram of a system 100 in accordance with some embodiments of the present disclosure. As illustratively shown in FIG. 1, the system includes devices 110, 130 and an oscillator 120. The device 110 is configured to provide a control signal VCTRL to the oscillator 120. The oscillator 120 is configured to generate an output signal VOUT according to the control signal VCTRL. The device 130 is configured to receive the output signal VOUT. In some embodiments, the devices 110, 130 and the oscillator 120 are implemented by semiconductor devices.

In some embodiments, the device 110 is referred to as a previous stage device of the oscillator 120. The device 130 is referred to as a next stage device of the oscillator 120. In some embodiments, the oscillator 120 is implemented by a voltage-controlled oscillator (VCO). The control signal VCTRL is implemented by a direct-current (DC) voltage signal, and the output signal VOUT is implemented by an alternating-current (AC) voltage signal.

Figure 2:
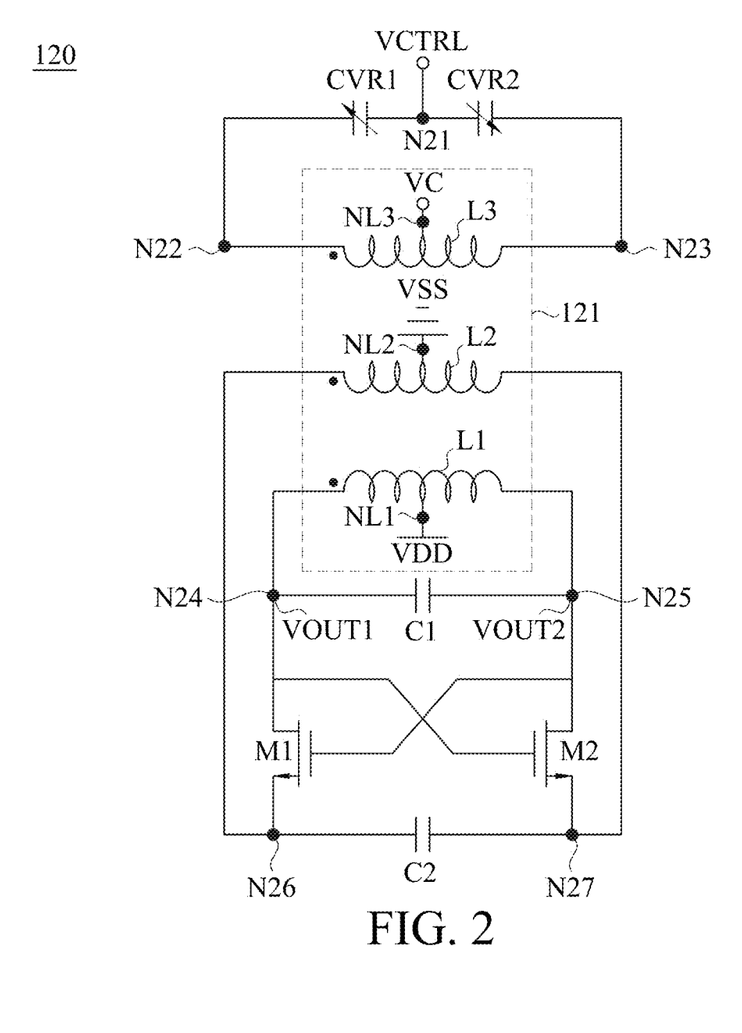
FIG. 2 is a circuit diagram of the oscillator shown in FIG. 1, in accordance with some embodiments of the present disclosure.

FIG. 2 is a circuit diagram of the oscillator 120 shown in FIG. 1, in accordance with some embodiments of the present disclosure. The oscillator 120 is configured to generate output signals VOUT1 and VOUT2 at the nodes N24 and N25, respectively. Referring to FIG. 1 and FIG. 2, the output signals VOUT1 and VOUT2 are embodiments of the output signal VOUT.

As illustratively shown in FIG. 2, the oscillator 120 includes varactors CVR1, CVR2, a trifilar transformer 121, capacitors C1, C2 and switches M1, M2. A terminal of the varactor CVR1 is configured to receive the control signal VCTRL at a node N21, and another terminal of the varactor CVR1 is coupled to the trifilar transformer 121 at a node N22. A terminal of the varactor CVR2 is configured to receive the control signal VCTRL at the node N21, and another terminal of the varactor CVR2 is coupled to the trifilar transformer 121 at a node N23.

A terminal of the capacitor C1 is coupled to the trifilar transformer 121 at a node N24, and another terminal of the capacitor C1 is coupled to the trifilar transformer 121 at a node N25. A terminal of the capacitor C2 is coupled to the trifilar transformer 121 at a node N26, and another terminal of the capacitor C2 is coupled to the trifilar transformer 121 at a node N27. A terminal of the switch M1 is coupled to the node N24, another terminal of the switch M1 is coupled to the node N26, and a control terminal of the switch M1 is coupled to the node N25. A terminal of the switch M2 is coupled to the node N25, another terminal of the switch M2 is coupled to the node N27, and a control terminal of the switch M2 is coupled to the node N24.

In some embodiments, the trifilar transformer 121 includes inductors L1-L3. The inductors L1-L3 are mutually coupled to each other with transformer coupling. A first terminal of the inductor L1 is coupled to the node N24, a second terminal of the inductor L1 is coupled to the node N25, and a third terminal of the inductor L1 is configured to receive a reference voltage signal VDD at a node NL1. A first terminal of the inductor L2 is coupled to the node N26, a second terminal of the inductor L2 is coupled to the node N27, and a third terminal of the inductor L2 is configured to receive a reference voltage signal VSS at a node NL2. A first terminal of the inductor L3 is coupled to the node N22, a second terminal of the inductor L3 is coupled to the node N23, and a third terminal of the inductor L3 is configured to receive a control signal VC at a node NL3. In some embodiments, the inductor L3 is referred to as a tertiary coil.

In some embodiments, the oscillator 120 is configured to operate as a transformer-based VCO. Accordingly, a low supply voltage is used. Specifically, a voltage level of the reference voltage signal VDD is within a range of 0.5 volt to 1 volt. For example, the voltage level of the reference voltage signal VDD is 0.6 volt. A voltage level of the reference voltage signal VSS is 0 volt. The mutual coupling between the inductors L1 and L2 enhances output swing of the output signals VOUT1 and VOUT2.

According to electronic theory, the oscillator 120 has two resonance frequencies WH and WL. In order to suppress flicker noise up-conversion, the ratio WH/WL is maintained to be approximately equal to 2.

In some embodiments, the frequency of the output signals VOUT1 and VOUT2 is controlled by the capacitances of the varactors CVR1 and CVR2. The capacitances of the varactors CVR1 and CVR2 is controlled linearly by a voltage difference between the nodes N21 and NL3. Alternatively stated, the capacitances of the varactors CVR1 and CVR2 is controlled by the control signals VCTRL and VC.

For example, each of the voltage levels of the control signals VCTRL and VC is changed in a range of 0 volt to 1 volt, such that the voltage difference between the nodes N21 and NL3 is changed in a range of −1 volt to 1 volt, and the capacitances of the varactors CVR1 and CVR2 are changed accordingly. As a result, a wider tuning range of the oscillator 120 is achieved.

For example, when the voltage level of the control signal VC is 0 volt and the voltage level of the control signal VCTRL is changed from 0 volt to 1 volt, the voltage difference between the nodes N21 and NL3 is changed from 0 volt to 1 volt, such that the capacitances of the varactors CVR1 and CVR2 are increased accordingly. When the voltage level of the control signal VC is 1 volt and the voltage level of the control signal VCTRL is changed from 1 volt to 0 volt, the voltage difference between the nodes N21 and NL3 is changed from 0 volt to-1 volt, such that the capacitances of the varactors CVR1 and CVR2 are decreased accordingly.

For the ratio WH/WL being equal to 2, the oscillator 120 is required to satisfy Equation (1) described below.

$$\frac{L_2 C_2}{L_1 C_1} = \frac{17 - 25 k_{12}^2 - 5\sqrt{25 k_{12}^4 - 34 k_{12}^2 + 9}}{8}. \quad \text{Equation (1)}$$

Specifically, $L_1$ and $L_2$ are inductances of the inductors L1 and L2, respectively, $C_1$ and $C_2$ are capacitances of the capacitors C1 and C2, respectively, and $k_{12}$ is a coupling coefficient between the inductors L1 and L2. For the square root term in the Equation (1) being real, the coupling coefficient $k_{12}$ is required to be smaller than 0.6.

In response to the mutual coupling between the inductors L1-L3, the inductor L3 is used to simultaneously change equivalent inductances of the inductors L1 and L2. Specifically, $L_1$ and $L_2$ are changed to $L_1(1+\Delta L_1)$ and $L_2(1+\Delta L_2)$, respectively. Further detail is given by Equation (2) described below.

$$\frac{L_2 C_2}{L_1 C_1} = \frac{L_2(1+\Delta L_2)C_2}{L_1(1+\Delta L_1)C_1} = \frac{L_1\left(1 + \dfrac{k_{13}^2}{1 - \dfrac{1}{W^2 L_3 C_V}}\right)C_2}{L_2\left(1 + \dfrac{k_{23}^2}{1 - \dfrac{1}{W^2 L_3 C_V}}\right)C_1}. \quad \text{Equation (2)}$$

Specifically, $k_{23}$ is a coupling coefficient between the inductors L3 and L2, $k_{13}$ is a coupling coefficient between the inductors L3 and L1, W is the output frequency of the oscillator 120, $L_3$ are inductance of the inductors L3, and $C_V$ is the range of capacitance variation of the varactors CVR1 and CVR2. In order to maintain the ratio $L_2 C_2/L_1 C_1$ during frequency tuning, the coupling coefficient $k_{13}$ is equal to the coupling coefficient $k_{23}$. In some embodiments, $1/\sqrt{L_3 C_{var}}$ is designed to be larger than 56 GHZ, to ensure stability, in which $C_{var}$ is a capacitance of the varactors CVR1 and CVR2.

In some approaches, in order to maintain a resonance frequency ratio while tuning an oscillator, varactors in a primary tank (which correspond to the capacitors C1 and C2) need to be adjusted simultaneously, which is hard to control, and degradation of quality factor due to varactors in the primary tank occurs.

Compared to above approaches, in some embodiments of present disclosure, the varactors CVR1 and CVR2 are used to tune the oscillator 120. The varactors CVR1 and CVR2 are easy to adjust by the control signals VCTRL and VC. Accordingly, fixed capacitors C1 and C2 are utilized in a primary tank of the oscillator 120. As a result, the degradation of quality factor due to varactor in the primary tank is prevented. Furthermore, the control signal VC is applied as center-tapped bias of the inductor L3 to achieve a wider tuning range.

Figure 3:
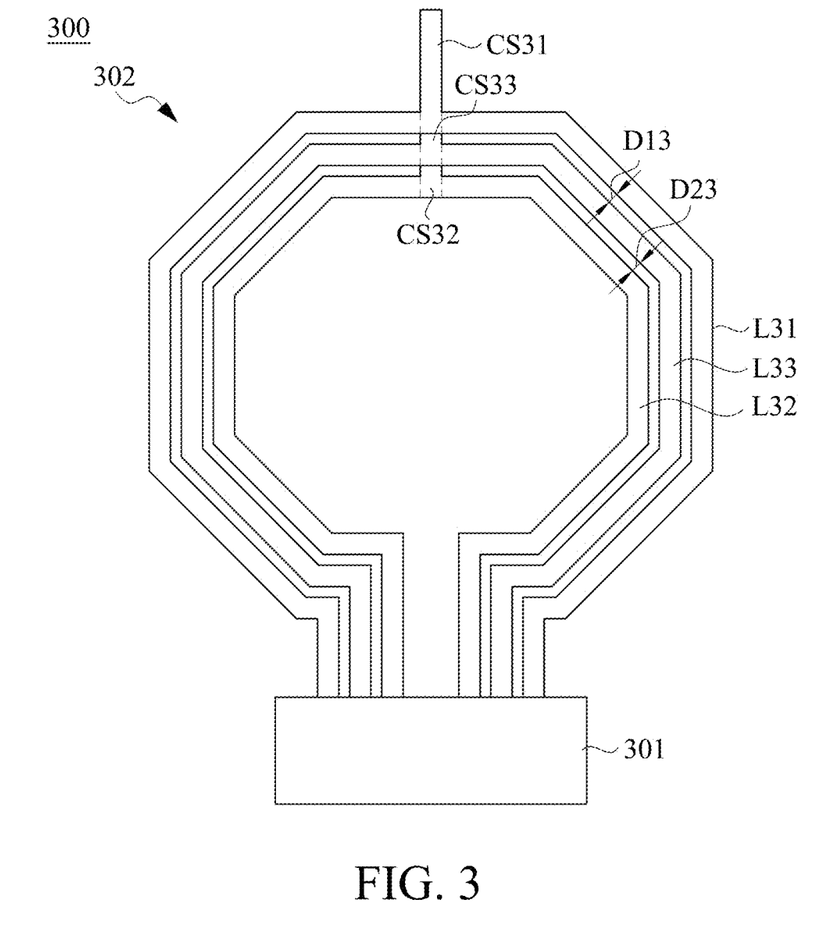
FIG. 3 is a schematic diagram of an oscillator corresponding to the oscillator shown in FIG. 2, in accordance with some embodiments of the present disclosure.

FIG. 3 is a schematic diagram of an oscillator 300 corresponding to the oscillator 120 shown in FIG. 2, in accordance with some embodiments of the present disclosure. As illustratively shown in FIG. 3, the oscillator includes a circuit 301 and a trifilar transformer 302. The trifilar transformer 302 includes inductors L31-L33 and conductive segments CS31-CS33. The inductor L33 is positioned between the inductors L31 and L32. Terminals of the inductors L31-L33 are coupled to the circuit 301. Further details of the circuit 301 are described below with the embodiments associated with FIG. 4.

In some embodiments, the inductors L31-L33 are disposed in the same layer. The conductive segments CS31-CS33 are coupled to the inductors L31-L33, respectively, through corresponding via structures.

As illustratively shown in FIG. 3, the inductors L31 and L33 are separated from each other by a distance D13, and the inductors L32 and L33 are separated from each other by a distance D23. In some embodiments, in order to meet the condition of $k_{13}$ being approximately equal to $k_{23}$, the distance D13 is approximately equal to D23.

Referring to FIG. 3 and FIG. 2, in some embodiments, the inductors L1-L3 are implemented by inductors L31-L33, respectively. The conductive segments CS31-CS33 are coupled to nodes NL1-NL3, respectively. Alternatively stated, the conductive segments CS31-CS33 are configured to receive the reference voltage signals VDD, VSS and the control signal VC, respectively.

Figure 4:
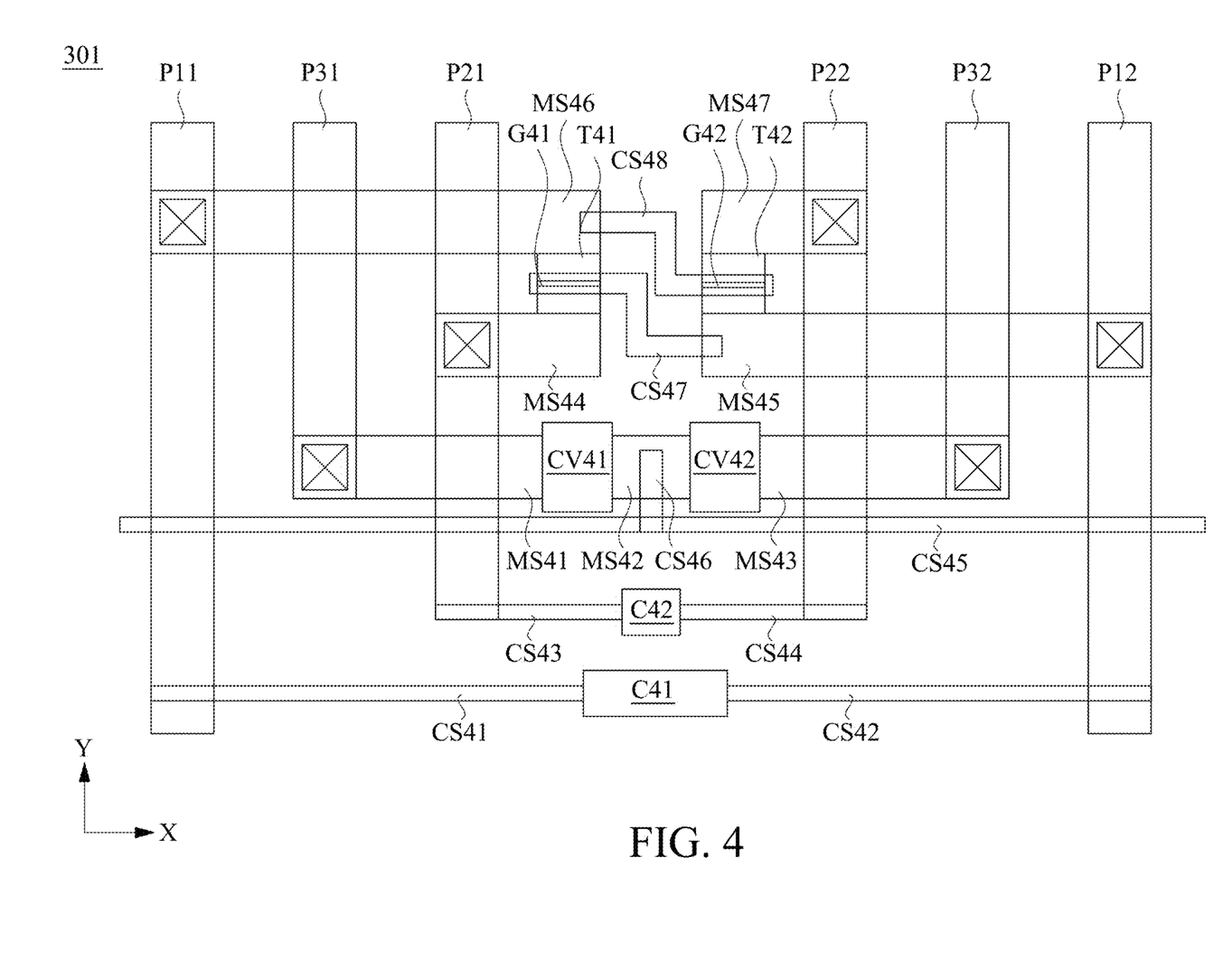
FIG. 4 is a schematic diagram of details of the circuit shown in FIG. 3, in accordance with some embodiments of the present disclosure.

FIG. 4 is a schematic diagram of details of the circuit 301 shown in FIG. 3, in accordance with some embodiments of the present disclosure. As illustratively shown in FIG. 4, the circuit 301 includes inductor portions P11, P12, P21, P22, P31, P32, conductive segments CS41-CS48, MS41-MS47, capacitors C41, C42, varactors CV41, CV42 and transistors T41, T42.

Referring to FIG. 3 and FIG. 4, the inductor L31 includes the inductor portions P11 and P12. The inductor L32 includes the inductor portions P21 and P22. The inductor L33 includes the inductor portions P31 and P32. Specifically, the inductor portions P11 and P12 correspond to two terminals of the inductor L31, respectively. The inductor portions P21 and P22 correspond to two terminals of the inductor L32, respectively. The inductor portions P31 and P32 correspond to two terminals of the inductor L33, respectively.

As illustratively shown in FIG. 4, the inductor portions P11, P31, P21, P22, P32 and P12 are arranged in order along an X direction, and are elongated along a Y direction perpendicular to the X direction. The inductor portion P11 is coupled to a terminal of the capacitor C41 through the conductive segment CS41. The inductor portion P12 is coupled to another terminal of the capacitor C41 through the conductive segment CS42. The inductor portion P21 is coupled to a terminal of the capacitor C42 through the conductive segment CS43. The inductor portion P22 is coupled to another terminal of the capacitor C42 through the conductive segment CS44. The inductor portion P31 is coupled to a terminal of the varactor CV41 through the conductive segment MS41. Another terminal of the varactor CV41 is coupled to a terminal of the varactor CV42 through the conductive segment MS42. Another terminal of the varactor CV42 is coupled to inductor portion P32 through the conductive segment MS43.

Furthermore, the conductive segment CS45 is coupled to the conductive segment MS42 through the conductive segment CS46. The inductor portion P11 is coupled to a terminal of the transistor T41 through the conductive segment MS46. The inductor portion P21 is coupled to another terminal of the transistor T41 through the conductive segment MS44. The inductor portion P22 is coupled to a terminal of the transistor T42 through the conductive segment MS47. The inductor portion P12 is coupled to another terminal of the transistor T42 through the conductive segment MS45. A gate structure G41 of the transistor T41 is coupled to the conductive segment MS45 through the conductive segment CS47. A gate structure G42 of the transistor T42 is coupled to the conductive segment MS46 through the conductive segment CS48. Along the X direction, the varactors CV41, CV42, the capacitors C41, C42 and the transistors T41, T42 are disposed between the inductor portions P21 and P22.

Referring to FIG. 2 and FIG. 4, in some embodiments, the elements of the oscillator 120 is implemented by the elements of the circuit 301. For example, the capacitors C1, C2, varactors CVR1, CVR2 and the switches M1, M2 are implemented by the capacitors C41, C42, varactors CV41, CV42 and the transistors T41, T42, respectively. Accordingly, the conductive segments CS45, CS46 and MS42 are configured to transmit the control signal VCTRL to the varactors CV41 and CV42. The nodes N22-N27 correspond to the conductive segments MS41, MS43, CS41, CS42, CS43 and CS44, respectively.

Figure 5:
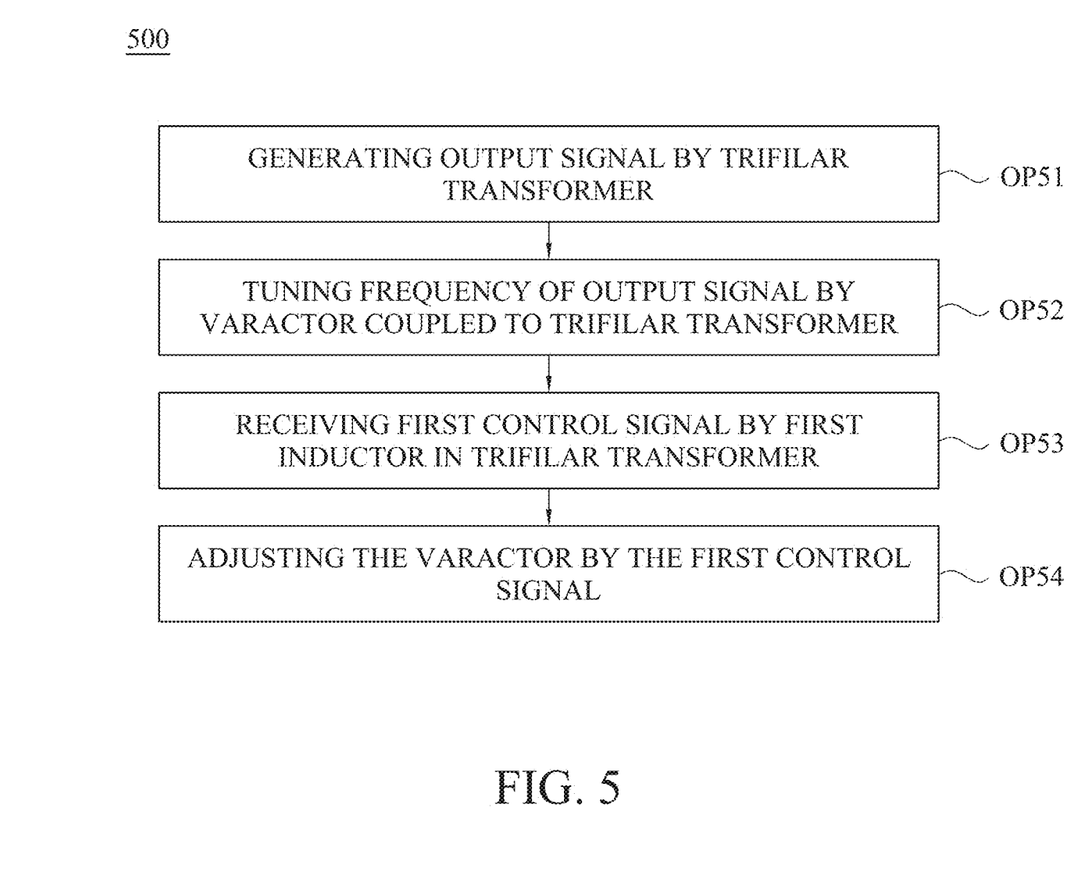
FIG. 5 is a flowchart diagram of a method corresponding to the oscillators shown in FIG. 2 and FIG. 3, in accordance with some embodiments of the present disclosure.

FIG. 5 is a flowchart diagram of a method 500 corresponding to the oscillators 120 and 300 shown in FIG. 2 and FIG. 3, in accordance with some embodiments of the present disclosure. As illustratively shown in FIG. 5, the method 500 includes operations OP51-OP54.

During the operations OP51, a trifilar transformer generates at least one output signal. For example, the trifilar transformer 121 generates the output signals VOUT1 and VOUT2.

During the operations OP52, at least one varactor coupled to the trifilar transformer tunes a frequency of the at least one output signal. For example, the varactors CVR1 and CVR2 coupled to the trifilar transformer 121 tunes a frequency of the output signals VOUT1 and VOUT2.

During the operations OP53, a first inductor in the trifilar transformer receives a first control signal. For example, the inductor L3 in the trifilar transformer 121 receives the control signal VC.

During the operations OP54, the first control signal adjusts the at least one varactor. For example, the control signal VC adjusts the capacitances of the varactors CVR1 and CVR2.

Figure 6:
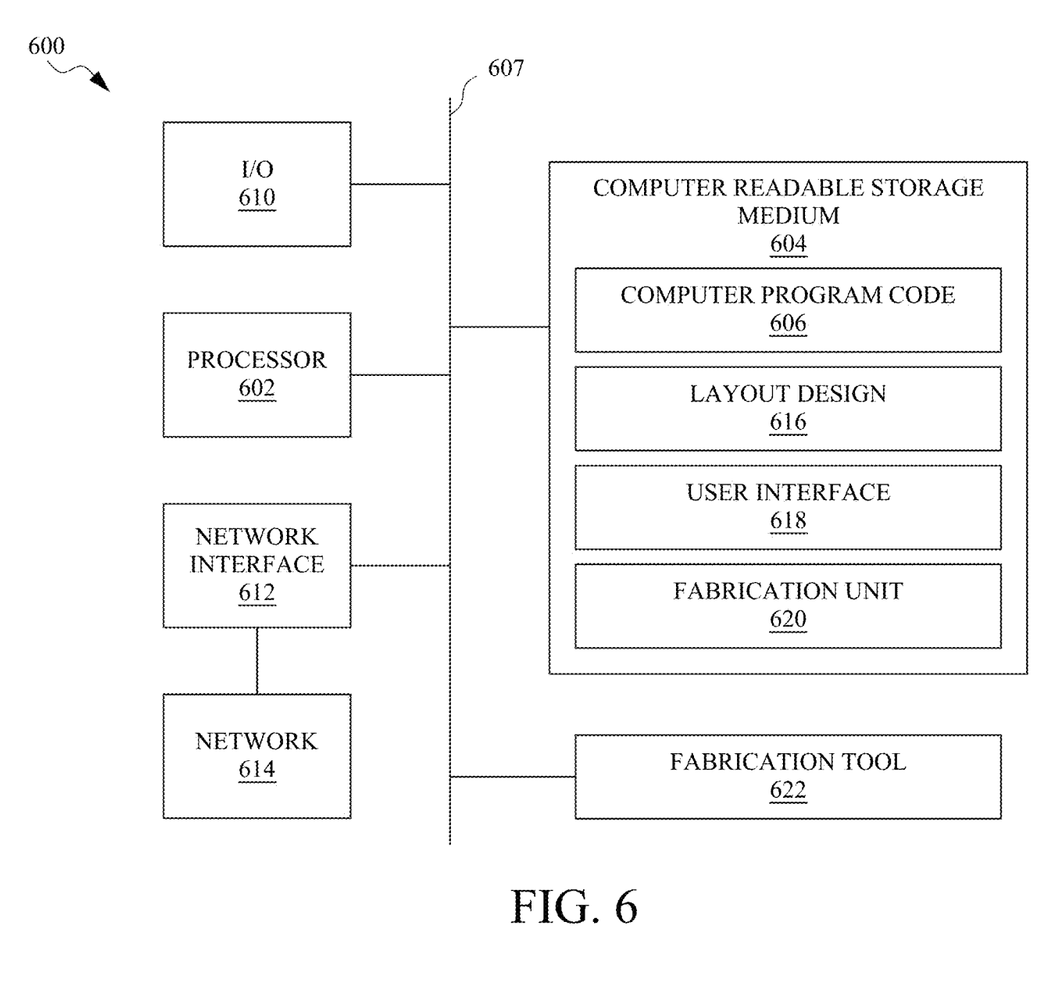
FIG. 6 is a schematic view of a system for designing and/or manufacturing of at least one of the oscillators shown in FIG. 2 and FIG. 3, in accordance with some embodiments of the present disclosure.

FIG. 6 is a schematic view of a system 600 for designing and/or manufacturing of at least one of the oscillators 120 and 300 shown in FIG. 2 and FIG. 3, in accordance with some embodiments of the present disclosure. The system 600 generates or places one or more IC layout designs corresponding to at least one of the oscillators 120 and 300, as described herein. In some embodiments, the system 600 manufactures one or more semiconductor devices based on the one or more IC layout designs, as described herein. The system 600 includes a hardware processor 602 and a non-transitory, computer readable storage medium 604 encoded with, e.g., storing, the computer program code 606, e.g., a set of executable instructions. The computer readable storage medium 604 is configured for interfacing with manufacturing machines for producing the semiconductor device. The processor 602 is electrically coupled to the computer readable storage medium 604 by a bus 607. The processor 602 is also electrically coupled to an I/O interface 610 by the bus 607. A network interface 612 is also electrically connected to the processor 602 by the bus 607. Network interface 612 is connected to a network 614, so that the processor 602 and the computer readable storage medium 604 are capable of connecting to external elements via network 614. The processor 602 is configured to execute the computer program code 606 encoded in the computer readable storage medium 604 in order to cause the system 600 designing and/or manufacturing of at least one of the oscillators 120 and 300.

In some embodiments, the processor 602 is a central processing unit (CPU), a multi-processor, a distributed processing system, an application specific integrated circuit (ASIC), and/or a suitable processing unit.

In some embodiments, the computer readable storage medium 604 is an electronic, magnetic, optical, electromagnetic, infrared, and/or a semiconductor system (or apparatus or device). For example, the computer readable storage medium 604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 604 includes a compact disk-read only memory (CD-ROM), a compact disk-read/write (CD-R/W), and/or a digital video disc (DVD).

In some embodiments, the storage medium 604 also stores information needed for designing and/or manufacturing of at least one of the oscillators 120 and 300, such as layout design 616, user interface 618, fabrication unit 620, and/or a set of executable instructions to designing and/or manufacturing of at least one of the oscillators 120 and 300.

In some embodiments, the storage medium 604 stores instructions (e.g., the computer program code 606) for interfacing with manufacturing machines. The instructions (e.g., the computer program code 606) enable the processor 602 to generate manufacturing instructions readable by the manufacturing machines to effectively implement the oscillators 120 and 300.

The system 600 includes the I/O interface 610. The I/O interface 610 is coupled to external circuitry. In some embodiments, the I/O interface 610 includes a keyboard, keypad, mouse, trackball, trackpad, and/or cursor direction keys for communicating information and commands to the processor 602.

The system 600 also includes the network interface 612 coupled to the processor 602. The network interface 612 allows the system 600 to communicate with the network 614, to which one or more other computer systems are connected. The network interface 612 includes wireless network interfaces such as BLUETOOTH, WIFI, WIMAX, GPRS, or WCDMA; or wired network interface such as ETHERNET, USB, or IEEE-13154. In some embodiments, the designing and/or manufacturing of at least one of the oscillators 120 and 300 is implemented in two or more systems 600, and information such as layout design, user interface and fabrication unit are exchanged between different systems 600 by the network 614.

The system 600 is configured to receive information related to a layout design through the I/O interface 610 or network interface 612. The information is transferred to the processor 602 by the bus 607 to determine a layout design for producing an IC. The layout design is then stored in the computer readable medium 604 as the layout design 616. The system 600 is configured to receive information related to a user interface through the I/O interface 610 or network interface 612. The information is stored in the computer readable medium 604 as the user interface 618. The system 600 is configured to receive information related to a fabrication unit through the I/O interface 610 or network interface 612. The information is stored in the computer readable medium 604 as the fabrication unit 620. In some embodiments, the fabrication unit 620 includes fabrication information utilized by the system 600.

In some embodiments, the designing and/or manufacturing of at least one of the oscillators 120 and 300 is implemented as a standalone software application for execution by a processor. In some embodiments, the designing and/or manufacturing of at least one of the oscillators 120 and 300 is implemented as a software application that is a part of an additional software application. In some embodiments, the designing and/or manufacturing of at least one of the oscillators 120 and 300 is implemented as a plug-in to a software application. In some embodiments, the designing and/or manufacturing of at least one of the oscillators 120 and 300 is implemented as a software application that is a portion of an EDA tool. In some embodiments, the designing and/or manufacturing of at least one of the oscillators 120 and 300 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, the manufacturing of at least one of the oscillators 120 and 300 is implemented by a manufacturing device to manufacture an integrated circuit using a set of masks manufactured based on one or more layout designs generated by the system 600. In some embodiments, the system 600 includes a manufacturing device (e.g., fabrication tool 622) to manufacture an integrated circuit using a set of masks manufactured based on one or more layout designs of the present disclosure.

Figure 7:
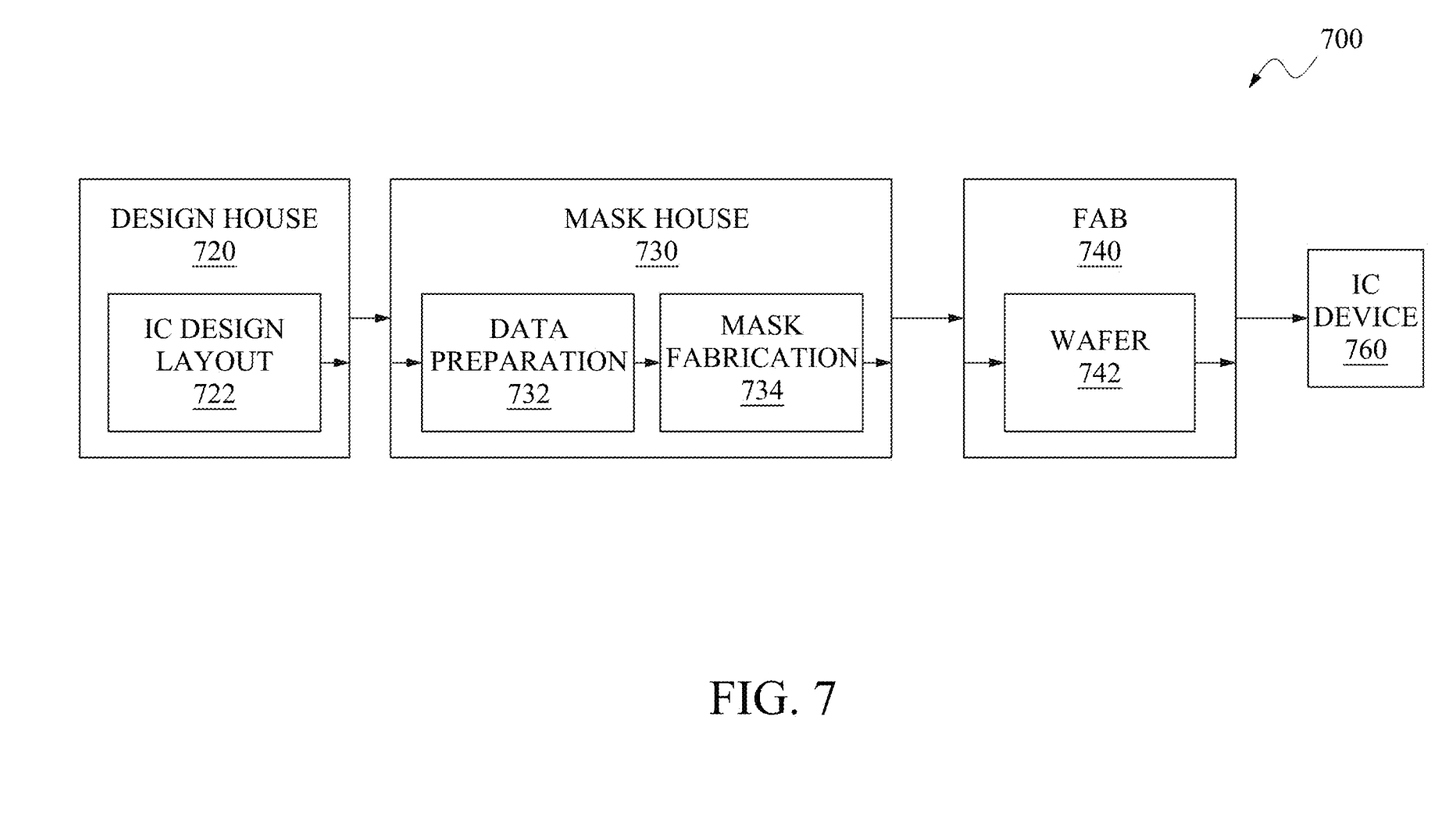
FIG. 7 is a block diagram of an integrated circuit (IC)/semiconductor device manufacturing system, and an IC manufacturing flow associated therewith, in accordance with some embodiments of the present disclosure.

FIG. 7 is a block diagram of an integrated circuit (IC)/ semiconductor device manufacturing system 700, and an IC manufacturing flow associated therewith, in accordance with some embodiments of the present disclosure.

In FIG. 7, the IC manufacturing system 700 includes entities, such as a design house 720, a mask house 730, and an IC manufacturer/fabricator ("fab") 740, that interact with one another in the design, development, and manufacturing cycles and/or services related to manufacturing an IC device (semiconductor device) 760 including at least one of the oscillators 120 and 300. The entities in system 700 are connected by a communications network. In some embodiments, the communications network is a single network. In some embodiments, the communications network is a variety of different networks, such as an intranet and the Internet. The communications network includes wired and/ or wireless communication channels. Each entity interacts with one or more of the other entities and provides services to and/or receives services from one or more of the other entities. In some embodiments, two or more of design house 720, mask house 730, and IC fab 740 is owned by a single company. In some embodiments, two or more of design house 720, mask house 730, and IC fab 740 coexist in a common facility and use common resources.

The design house (or design team) 720 generates an IC design layout 722. The IC design layout 722 includes various geometrical patterns designed for the IC device 760. The geometrical patterns correspond to patterns of metal, oxide, or semiconductor layers that make up the various components of the IC device 760 to be fabricated. The various layers combine to form various IC features. For example, a portion of the IC design layout 722 includes various IC features, such as an active region, gate structures, source/drain structures, interconnect structures, and openings for bonding pads, to be formed in a semiconductor substrate (such as a silicon wafer) and various material layers disposed on the semiconductor substrate. The design house 720 implements a proper design procedure to form the IC design layout 722. The design procedure includes one or more of logic design, physical design or place and route. The IC design layout 722 is presented in one or more data files having information of the geometrical patterns. For example, the IC design layout 722 can be expressed in a GDSII file format or DFII file format.

The mask house 730 includes mask data preparation 732 and mask fabrication 734. The mask house 730 uses the IC design layout 722 to manufacture one or more masks to be used for fabricating the various layers of the IC device 760 according to the IC design layout 722. The mask house 730 performs the mask data preparation 732, where the IC design layout 722 is translated into a representative data file ("RDF"). The mask data preparation 732 provides the RDF to the mask fabrication 734. The mask fabrication 734 includes a mask writer. A mask writer converts the RDF to an image on a substrate, such as a mask (reticle) or a semiconductor wafer, or a metal layer which is formed and thereafter selectively etched to form a redistribution layer at a back end of line process of the fab. The design layout is manipulated by the mask data preparation 732 to comply with particular characteristics of the mask writer and/or requirements of the IC fab 740. In FIG. 7, the mask data preparation 732 and mask fabrication 734 are illustrated as separate elements. In some embodiments, the mask data preparation 732 and mask fabrication 734 can be collectively referred to as mask data preparation.

In some embodiments, the mask data preparation 732 includes optical proximity correction (OPC) which uses lithography enhancement techniques to compensate for image errors, such as those that can arise from diffraction, interference, other process effects and the like. OPC adjusts the IC design layout 722. In some embodiments, the mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 732 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during the mask fabrication 734, which may undo part of the modifications performed by OPC in order to meet mask creation rules.

In some embodiments, the mask data preparation 732 includes lithography process checking (LPC) that simulates processing that will be implemented by the IC fab 740 to fabricate the IC device 760. LPC simulates this processing based on the IC design layout 722 to create a simulated manufactured device, such as the IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the IC design layout 722.

It should be understood that the above description of the mask data preparation 732 has been simplified for the purposes of clarity. In some embodiments, the mask data preparation 732 includes additional features such as a logic operation (LOP) to modify the IC design layout according to manufacturing rules. Additionally, the processes applied to the IC design layout 722 during the mask data preparation 732 may be executed in a variety of different orders.

After the mask data preparation 732 and during mask fabrication 734, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by the mask fabrication 734 is used in a variety of processes. For example, such a mask(s) is used in an ion implantation process to form various doped regions in the semiconductor wafer, in an etching process to form various etching regions in the semiconductor wafer, and/or in other suitable processes.

The IC fab 740 is an IC fabrication entity that includes one or more manufacturing facilities for the fabrication of a variety of different IC products. In some embodiments, the IC fab 740 is a semiconductor foundry. For example, there may be a first manufacturing facility for the front end fabrication of a plurality of IC products (e.g., source/drain structures, gate structures), while a second manufacturing facility may provide the middle end fabrication for the interconnection of the IC products (e.g., MDs, VDs, VGs) and a third manufacturing facility may provide the back end fabrication for the interconnection and packaging of the IC products (e.g., M0 tracks, M1 tracks, BM0 tracks, BM1 tracks), and a fourth manufacturing facility may provide other services for the foundry entity.

The IC fab 740 uses the mask (or masks) fabricated by the mask house 730 to fabricate the IC device 760. Thus, the IC fab 740 at least indirectly uses the IC design layout 722 to fabricate the IC device 760. In some embodiments, a semiconductor wafer is fabricated by the IC fab 740 using the mask (or masks) to form the IC device 760. The semiconductor wafer 742 includes a silicon substrate or other proper substrate having material layers formed thereon. Semiconductor wafer further includes one or more of various doped regions, dielectric features, multilevel interconnects, and the like (formed at subsequent manufacturing steps).

Also disclosed is a semiconductor device. The semiconductor device includes a first inductor, a second inductor and at least one varactor. The first inductor is configured to output at least one output signal. The second inductor is coupled to the first inductor with transformer coupling. The at least one varactor is coupled to the second inductor. A frequency of the at least one output signal is tuned according to the at least one varactor.

Also disclosed is a method. The method includes: generating at least one output signal by a trifilar transformer; tuning a frequency of the at least one output signal by at least one varactor coupled to the trifilar transformer; receiving a first control signal by a first inductor in the trifilar transformer; and adjusting the at least one varactor by the first control signal. The first inductor is coupled to the at least one varactor.

Also disclosed is a semiconductor device. The semiconductor device includes at least one varactor, a first inductor, a second inductor and a third inductor. The first inductor is coupled to the at least one varactor. The second inductor is separated from the first inductor by a first distance. The third inductor is separated from the first inductor by a second distance. The first distance is same as the second distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first inductor configured to output at least one output signal;
   a second inductor coupled to the first inductor with transformer coupling;
   a third inductor coupled to the first inductor and the second inductor as a trifilar transformer; and
   at least one varactor coupled to the second inductor,
   wherein a frequency of the at least one output signal is tuned according to the at least one varactor,
   the at least one varactor is configured to receive a first control signal changed from a first voltage level to a second voltage level,
   the third inductor is configured to receive a first reference voltage signal,
   the first inductor is configured to receive a second reference voltage signal, and
   a first voltage level of the first reference voltage signal is lower than a second voltage level of the second reference voltage signal.

2. The semiconductor device of claim 1, wherein the at least one varactor comprises:
   a first varactor and a second varactor coupled in series, wherein the second inductor is coupled between the first varactor and the second varactor.

3. The semiconductor device of claim 2, wherein each of the first varactor and the second varactor is configured to receive the first control signal,
   the second inductor is configured to receive a second control signal, and
   capacitances of the first varactor and the second varactor are changed according to a voltage difference between the first control signal and the second control signal.

4. The semiconductor device of claim 3, wherein when the second control signal has the first voltage level and the first control signal is changed from the first voltage level to a third voltage level, the capacitances are increased.

5. The semiconductor device of claim 4, wherein when the second control signal has the third voltage level and the first control signal is changed from the third voltage level to the first voltage level, the capacitances are decreased.

6. The semiconductor device of claim 1, wherein
   the third inductor is coupled to the first inductor and the second inductor with transformer coupling.

7. The semiconductor device of claim 6, further comprising:
   a first transistor coupled between the first inductor and the third inductor; and
   a second transistor coupled between the first inductor and the third inductor,
   wherein control terminals of the first transistor and the second transistor are coupled to two terminals of the first inductor, respectively.

8. The semiconductor device of claim 7, further comprising:
   a capacitor, two terminals of the capacitor are coupled to the two terminals of the first inductor, respectively.

9. The semiconductor device of claim 7, further comprising:
   a capacitor, two terminals of the capacitor are coupled to two terminals of the third inductor, respectively.

10. A method, comprising:
    generating at least one output signal by a trifilar transformer;
    tuning a frequency of the at least one output signal by at least one varactor coupled to the trifilar transformer;
    receiving a first control signal by a first inductor in the trifilar transformer;
    adjusting the at least one varactor by the first control signal;
    receiving a first reference voltage signal by a second inductor in the trifilar transformer; and
    receiving a second reference voltage signal by a third inductor in the trifilar transformer,
    wherein the first inductor is coupled to the at least one varactor, and
    a first voltage level of the first reference voltage signal is lower than a second voltage level of the second reference voltage signal.

11. The method of claim 10, further comprising:
    receiving a second control signal by the at least one varactor; and adjusting capacitances of the at least one varactor according to a voltage difference between the first control signal and the second control signal.

12. The method of claim 11, wherein receiving the second control signal comprises:
   receiving the second control signal by a first varactor of the at least one varactor at a first node; and
   receiving the second control signal by a second varactor of the at least one varactor at the first node.

13. The method of claim 12, wherein the first inductor is coupled between the first varactor and the second varactor.

14. The method of claim 10, further comprising:
   adjusting the first control signal from the first voltage level to a third voltage level,
   wherein the third voltage level is higher than the second voltage level.

15. A semiconductor device, comprising:
   at least one varactor;
   a first inductor coupled to the at least one varactor;
   a second inductor separated from the first inductor by a first distance; and
   a third inductor separated from the first inductor by a second distance,
   wherein the first distance is same as the second distance,
   the at least one varactor is disposed between two terminals of the third inductor,
   the third inductor is configured to receive a first reference voltage signal,
   the second inductor is configured to receive a second reference voltage signal, and
   a first voltage level of the first reference voltage signal is lower than a second voltage level of the second reference voltage signal.

16. The semiconductor device of claim 15, wherein the at least one varactor comprises a first varactor and a second varactor,
   the first inductor comprises:
      a first inductor portion coupled to the first varactor; and
      a second inductor portion coupled to the second varactor,
   wherein the first inductor portion, the first varactor, the second varactor and the second inductor portion are arranged in order.

17. The semiconductor device of claim 16, further comprising:
   a capacitor,
   wherein the second inductor comprises:
      a third inductor portion coupled to a first terminal of the capacitor; and
      a fourth inductor portion coupled to a second terminal of the capacitor,
   wherein the third inductor portion, the first inductor portion, the second inductor portion and the fourth inductor portion are arranged in order.

18. The semiconductor device of claim 16, further comprising:
   a capacitor,
   wherein the third inductor comprises:
      a third inductor portion coupled to a first terminal of the capacitor; and
      a fourth inductor portion coupled to a second terminal of the capacitor,
   wherein the first inductor portion, the third inductor portion, the fourth inductor portion and the second inductor portion are arranged in order.

19. The semiconductor device of claim 18, further comprising:
   a first transistor and a second transistor located between the third inductor portion and the fourth inductor portion,
   wherein two terminals of the first transistor are coupled to the third inductor portion and the second inductor, respectively, and
   two terminals of the second transistor is coupled to the fourth inductor portion and the second inductor, respectively.

20. The semiconductor device of claim 15, wherein the first inductor, the second inductor and the third inductor are comprised in a trifilar transformer.

* * * * *